US012400921B2

(12) United States Patent
Bouvier et al.

(10) Patent No.: US 12,400,921 B2
(45) Date of Patent: Aug. 26, 2025

(54) THROUGH-INTERPOSER GROUNDING USING BLIND VIAS

(71) Applicant: Murata Manufacturing Co., Ltd., Nagaokakyo (JP)

(72) Inventors: Stéphane Bouvier, Cairon (FR); Emmanuel Lefeuvre, Caen (FR); Frédéric Voiron, Barraux (FR)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 500 days.

(21) Appl. No.: 17/850,495

(22) Filed: Jun. 27, 2022

(65) Prior Publication Data

US 2022/0338349 A1 Oct. 20, 2022

Related U.S. Application Data

(63) Continuation of application No. PCT/IB2021/050456, filed on Jan. 21, 2021.

(30) Foreign Application Priority Data

Jan. 21, 2020 (EP) .................................. 20 305 044

(51) Int. Cl.
*H01L 23/14* (2006.01)
*H01S 5/02315* (2021.01)
(52) U.S. Cl.
CPC ........ *H01L 23/147* (2013.01); *H01S 5/02315* (2021.01)
(58) Field of Classification Search
CPC ............. H01L 23/147; H01L 23/49827; H01S 5/02315
See application file for complete search history.

(56) References Cited

U.S. PATENT DOCUMENTS 4,933,739 A * 6/1990 Harari .................... H10B 10/15
257/E27.101
6,518,864 B1 * 2/2003 Ito .......................... H01P 3/003
333/246

(Continued)

FOREIGN PATENT DOCUMENTS

CN 210579552 U 5/2020
DE 102011088581 A1 9/2012

(Continued)

OTHER PUBLICATIONS

Volker Blaschke and Hadi Jebory, Test Structure and analysis for Accurate RF-Characterization of Tungsten Through Silicon via (TSV) Grounding Devices IEEE Int Conf. Microelectronic Test Structure, Mar. 25-28, 2013 (Year: 2013).*

(Continued)

*Primary Examiner* — Dale E Page
*Assistant Examiner* — Cristian A Tivarus
(74) *Attorney, Agent, or Firm* — ArentFox Schiff LLP

(57) ABSTRACT

A current path is provided through an interposer to ground a grounding pattern associated with a transmission line, by exploiting an interposer substrate that has a high-resistivity portion at a first surface and a low-resistivity portion extending from the high-resistivity portion to a second surface of the interposer. Moreover, a set of blind via-holes comprising electrically-conductive material extend from the first surface of the interposer substrate through the high-resistivity portion and into the low-resistivity portion. Top-to-bottom connection can be made using the conductive material in the blind vias and using the low-resistivity portion of the substrate, while the high-resistivity portion of the substrate impedes current leakage from the transmission line to the second surface of the substrate. The number and dimensions of the blind via-holes control the impedance of the ground- (Continued)

ing pattern relative to the transmission line's characteristic impedance.

20 Claims, 3 Drawing Sheets

(56) References Cited

U.S. PATENT DOCUMENTS

| | | | | |
|---|---|---|---|---|
| 8,598,713 | B2* | 12/2013 | Blaschke | H01L 21/743 |
| | | | | 257/E21.585 |
| 10,873,120 | B2 | 12/2020 | Xu | |
| 11,245,170 | B2 | 2/2022 | Xu | |
| 2004/0012938 | A1* | 1/2004 | Sylvester | H01L 21/4857 |
| | | | | 257/E23.079 |
| 2008/0012087 | A1* | 1/2008 | Dautet | H01L 31/107 |
| | | | | 257/438 |
| 2012/0241901 | A1 | 9/2012 | Kotlanka et al. | |
| 2015/0346442 | A1 | 12/2015 | Tamura | |
| 2019/0296414 | A1 | 9/2019 | Xu | |
| 2021/0066775 | A1 | 3/2021 | Xu | |

FOREIGN PATENT DOCUMENTS

| | | |
|---|---|---|
| DE | 102013208816 A1 | 11/2014 |
| EP | 2445004 A1 | 4/2012 |

OTHER PUBLICATIONS

International Search Report issued for PCT/IB2021/050456, date of mailing Mar. 31, 2021.

* cited by examiner

THROUGH-INTERPOSER GROUNDING USING BLIND VIAS

CROSS REFERENCE TO RELATED APPLICATIONS

This application is a continuation of PCT Application No. PCT/IB2021/050456, filed Jan. 21, 2021, which claims priority to European Patent Application No. 20305044.8, filed Jan. 21, 2020, the entire contents of each of which are hereby incorporated in their entirety.

TECHNICAL FIELD

The present invention relates to the field of interposers as well as to methods of fabricating interposers and a technique for achieving electrical interconnection through an interposer.

BACKGROUND

Various types of interposers are used in the field of electronics. For example, optical interposers (e.g., photonic interposers) are in wide-spread use, for example as part of optical interconnects used in data centres. An optical interposer generally includes a substrate that is mounted on a mounting substrate, and elements such as a transmission line are provided on a surface of the interposer substrate that is remote from the mounting substrate. To assure desired properties for the transmission line, the interposer substrate generally is configured as an electrical insulator or is a substrate (e.g., high-resistivity (HR) silicon) having sufficiently high resistivity to prevent undesired current leakage.

Often optical interposers are used in sets arranged side by side on a mounting substrate. For instance, a transmitter optical sub-assembly ("TOSA") in a transceiver module may include four optical interposers disposed side by side. An example of such a TOSA is illustrated in FIG. 1.

It has been found that, at high frequencies, there are peaks in the insertion loss of TOSAs, attributable to bad ground uniformity over the surface of the optical interposers. FIG. 2 illustrates how insertion loss varies with frequency in the TOSA illustrated in FIG. 1. It can be seen from FIG. 2 that there are insertion loss peaks at the frequency positions indicated by the arrows A. Up to now it has been considered that this problem should be addressed by improving grounding in the interposers, for example by providing wire bonds between the grounding patterns of neighbouring interposers, or wire bonds between the grounding pattern of an interposer and a grounding pattern on the underlying mounting substrate. FIG. 3 is a schematic representation of an individual interposer having wire bonds connecting a grounding pattern on the interposer to ground on the mounting substrate.

However, when wire bonds are used to connect a grounding pattern on the interposer to ground on the substrate or ground on neighbouring interposers, cross-talk may be generated between the bonding wires themselves.

Besides, the impedance of these wire bonds is non-negligible. To realize an optimized ground return, its impedance and particularly the inductive behaviour of the wire bonds (correlated to the ratio length/section) can be decreased by reducing their length. From an integration point of view, this is more efficient than increasing the section of the ground return path.

Moreover, from a purely practical point of view, appreciable space is needed to accommodate the bonding wires, which increases the footprint required for the interposer on the mounting substrate. Moreover, in some designs there is insufficient space between interposers in a group, to accommodate such bonding wires, or insufficient space between an outermost interposer and the wall of a package in which the interposer is located to allow for bonding wires to pass towards the mounting substrate.

In principle it could be contemplated to achieve grounding between a grounding pattern on the interposer and a grounding pattern on an underlying mounting substrate by using through-silicon vias ("TSVs"). However, in the case of optical interposers the thickness of the interposer is relatively large (>500 µm) in order to achieve necessary optical alignment of the laser, and this would necessitate use of a long TSV. For manufacturing reasons, there are limitations on the allowable aspect ratio of a TSV and so, if the TSV is long, then the footprint occupied on the circuit board (i.e., the cross-sectional surface area of the TSV) would be large and this is incompatible with achieving a high degree of integration. Besides, TSVs are generally filled with metals that have a coefficient of thermal expansion which is quite different from the coefficient of thermal expansion of the interposer substrate, leading to undesired stresses in the interposer substrate. Furthermore, specific manufacturing steps are required in order to define, form and fill TSVs, additional to the manufacturing steps required to create the interposer and the circuit elements thereon. Thus, use of TSVs for grounding can lead to increased complexity in the manufacturing process.

Another technique that could be contemplated to achieve grounding between a grounding pattern on the interposer and a grounding pattern on an underlying mounting substrate would be to metallize the sides of the interposer substrate. However, such an approach would likewise require additional manufacturing steps, leading to an increase in the cost and complexity of the process of manufacturing the interposer.

SUMMARY OF THE INVENTION

The present invention has been made in the light of the above-described issues.

Thus, in exemplary aspect, an interposer is provided comprising a substrate; a grounding pattern on a first surface of the substrate; and a transmission line on the first surface of the substrate, coplanar with said grounding pattern. Moreover, in the exemplary aspect, the substrate is a composite substrate comprising a high-resistivity portion extending from said first surface into the bulk of the substrate, and a low-resistivity portion extending from the high-resistivity portion to a second surface of the substrate opposite to the first surface; a set of blind via-holes extends from said first surface of the substrate through the high-resistivity portion of the substrate into the low-resistivity portion of the substrate; and electrically-conductive structure is provided in the blind via-hole(s) and interconnects the grounding pattern on the first surface of the substrate with the low resistivity portion of the substrate. Furthermore, in this aspect, the impedance value of the grounding pattern is less than 10% of the characteristic impedance of the transmission line due to the number of blind via-holes in said set and the dimensions of said blind via-holes; and the thickness of the high-resistivity portion is in the range of 10 µm to 400 µm.

The above-described combination of features configures the grounding pattern to be connected effectively to ground through the substrate, achieving a suitable level of impedance of the grounding pattern relative to the characteristic impedance of the transmission line, while also reducing current leakage from the transmission line to the mounting substrate.

This electrically-conductive structure may be composed of a simple electrically-conductive layer provided at the sidewall of the blind via-hole but the invention is not limited to this case. For example, a multi-layer may be provided at the sidewall, this multi-layer comprising a highly-resistive material on its outer periphery overlaid with one, or several, layers having different conductivities (e.g., closer to the axis of the via-hole).

In the case of a co-integration of the via with an adjacent capacitor, the conductive layer may comprise a stacked combination of conductive and insulating layers following the implementation of a MIM structure of the adjacent capacitor. In this case, a common set of process steps can be used to form the capacitor MIM structure and the electrically-conductive structure in the blind via-hole, thus avoiding increase in the complexity and cost of the manufacturing process.

The high-resistivity portion of the composite substrate used in the above-described interposer prevents current leakage between elements (notably, the transmission line) formed on the first surface of the interposer and the mounting substrate upon which the interposer is mounted in use. At the same time, the low-resistivity portion of the composite substrate used in the above-described interposer cooperates with conductive material in the blind via-hole(s) to establish a top-to-bottom connection structure through the interposer substrate.

With the above-described structure, an interposer according to exemplary embodiments establishes a direct conductive path between the grounding pattern and the ground of a mounting substrate upon which the interposer is mounted in use through the die itself. This configuration shortens the length of the electrical connection. Accordingly, the length of the ground connection between the interposer and the mounting substrate is reduced, and the uniformity of the ground potential is increased.

The above-described interposer structure enables grounding to be achieved without using bonding wires for this purpose. Accordingly, no extra footprint on the mounting substrate is required. The above-described interposer structure enables grounding to be achieved without using TSVs for this purpose, reducing the complexity of the manufacturing process (see below).

In the above-described interposer, the electrically-conductive material in the blind via-hole(s) can also comprise a conductive layer provided on the side walls of the blind via-hole(s). The low-resistivity portion of the substrate, and the conductive layer provided on the side wall of the blind via-hole(s), can both be made of semiconductor material and may be doped by dopants of the same polarity as one another. The high-resistivity portion of the interposer substrate can also be made of semiconductor and may have doping of the same or different polarity from that of the doped via-hole sidewalls.

In the above-described interposer, a filling may be provided in the blind via-holes to prevent ingress of undesired impurities and the like. In some cases, a doped polysilicon filling material may be provided in the blind via-hole(s) and this acts as an additional contributor for top-to-bottom connection through the interposer. In some cases the interposer contains 3D capacitors (e.g., trench capacitors) as well as the blind via-holes, and during formation of the dielectric and electrode layers of the 3D capacitors the same dielectric and conductive materials may be deposited into the blind via-holes such that insulating layers are deposited within the via between the doped walls and the polysilicon itself, thus creating an auxiliary capacitor. At high frequencies, the impedance of this auxiliary capacitor becomes negligible and current can flow from the polysilicon to the low-resistivity portion of the substrate, in addition to the main parallel path formed by the conductive side walls of the blind via-hole. This improves the high-frequency performance of the device, and reduces electrical losses.

Exemplary embodiments of interposer have a transmission line provided on the first surface of the substrate and the high-resistivity portion of the substrate impedes current leakage, or losses, from the transmission line to the high-resistivity portion of the substrate (and, therefore, impedes current leakage to the mounting substrate).

In addition, according to an exemplary aspect, a method is provided for fabricating an interposer that includes forming relief features in a first surface of a composite substrate, said composite substrate comprising a high-resistivity portion extending from said first surface into the bulk of the substrate, and a low-resistivity portion extending from the high-resistivity portion to a second surface of the substrate opposite to the first surface, and said relief features comprising a set of blind via-holes extending from said first surface of the substrate through the high-resistivity portion of the substrate into the low-resistivity portion of the substrate; forming a grounding pattern on the first surface of the substrate; forming a transmission line on the first surface of the substrate, coplanar with said grounding pattern; and forming an electrically-conductive layer at the side walls of the blind via-holes. Moreover, according to the exemplary method, the conductive sidewall layer is connected to the grounding pattern on the first surface of the substrate and, with the low-resistivity portion of the substrate, forms a grounding path for current through the interposer substrate; the impedance value of the grounding pattern is less than of the characteristic impedance of the transmission line due to the number of blind via-holes in said set and the dimensions of said blind via-holes; and the thickness of the high-resistivity portion is in the range of 10 µm to 400 µm.

The above-recited method provides comparable advantages to those mentioned above in relation to the interposer of the exemplary aspect. Formation of the blind via-holes in the above-described method is simpler than formation of TSVs, notably because the blind via-holes do not need to traverse the full thickness of the interposer substrate. Moreover, only a limited number of process steps are required in order to form the new structure.

The electrically-conductive sidewall layer connected to the grounding pattern on the first surface of the substrate provides a grounding path through the interposer.

The above-described method may include a step of wholly or partially filling the blind via-holes with material, to prevent ingress of impurities, humidity, etc. The material wholly or partially filling the blind via-holes may be an electrically-conductive material, e.g., doped polysilicon.

Moreover, in several types of interposer, additional holes may be formed in the first surface of the interposer substrate, besides the blind via-holes. In such cases, a common set of process steps may be used to form the blind via-holes and the holes required by the other components on the interposer, so that the presence of the blind via-holes causes a negligible increase in the complexity of the process of manufacturing the interposer.

In certain example implementations, the interposer includes 3D capacitors formed in holes (e.g., trenches), or formed over pillars, at the first surface of the interposer substrate. In such cases, common process steps may be used to form the holes/pillars of the 3D capacitors and to form the blind via-holes of the invention. Furthermore, process steps which form layers of the 3D capacitor structure may be exploited to also deposit material on the side walls of, or within, the blind via-holes of the invention. Once again, the presence of the blind via-holes causes a negligible increase in the complexity of the process of manufacturing such interposers.

BRIEF DESCRIPTION OF THE DRAWINGS

Additional features and advantages of the exemplary embodiments of the present invention will become apparent from the following description of certain embodiments thereof, given by way of illustration only, not limitation, with reference to the accompanying drawings in which.

DETAILED DESCRIPTION

An interposer according to an exemplary embodiment of the invention will now be described with reference to FIGS. 4 and 5, and an exemplary manufacturing method for fabricating the interposer will be described with reference to FIG. 6. In the example described with reference to FIGS. 4-6, the interposer is an optical interposer and a through-interposer connection is implemented using blind via-holes and a composite substrate. However, it should be noted that the invention is not limited to application in optical interposers but finds general application in providing through-interposer connections that realize grounding.

Figure 1:
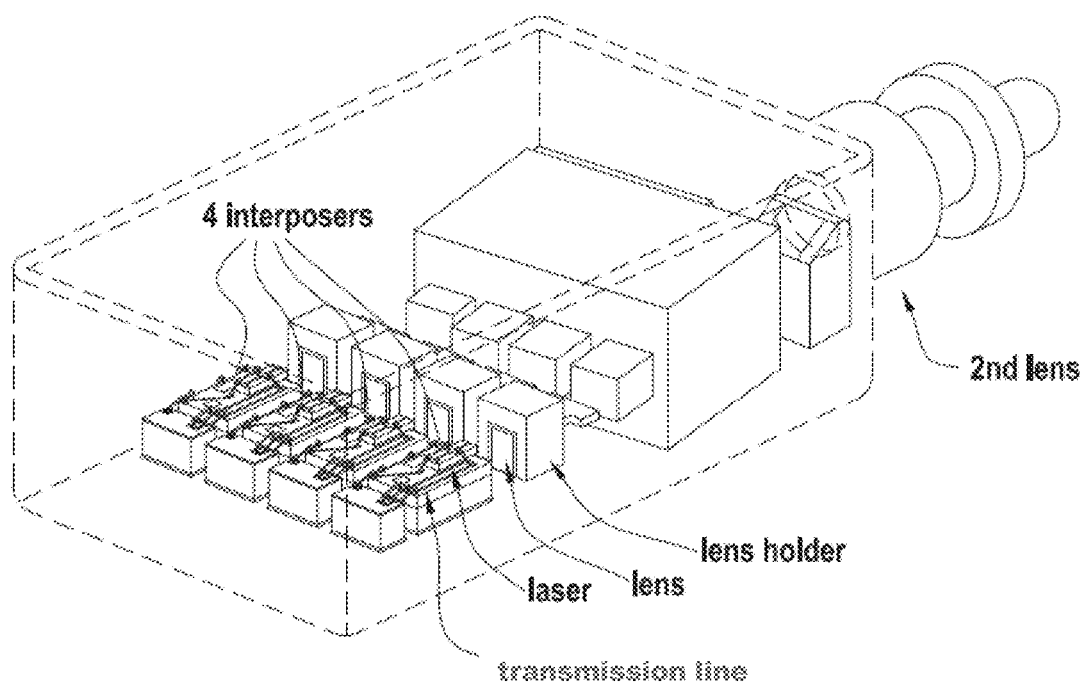
FIG. 1 is a drawing illustrating a transmitter optical sub-assembly (TOSA) in a transceiver module, including four optical interposers.
Figure 2:
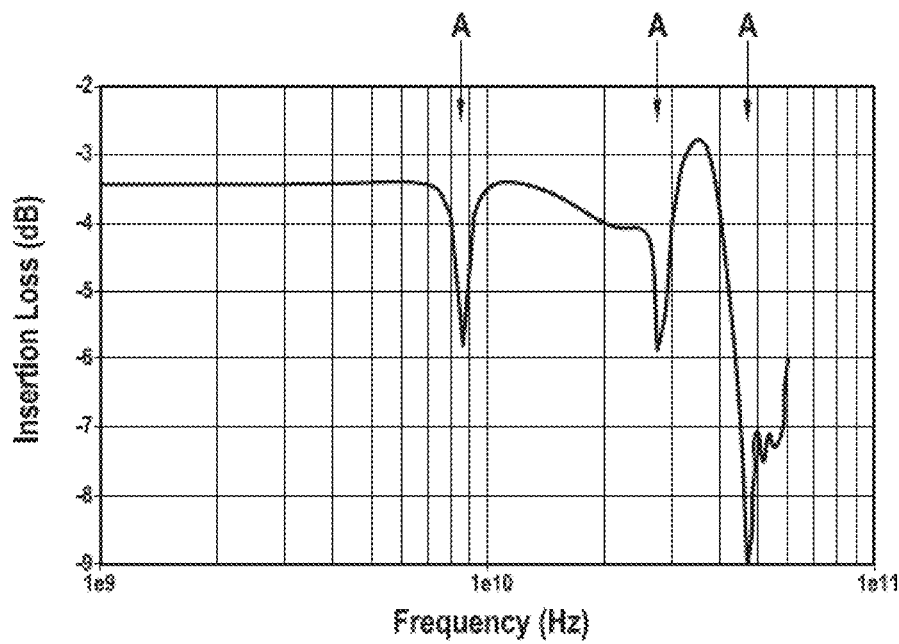
FIG. 2 is a graph showing how insertion loss varies with frequency in an optical interposer of the TOSA illustrated in FIG. 1.
Figure 3:
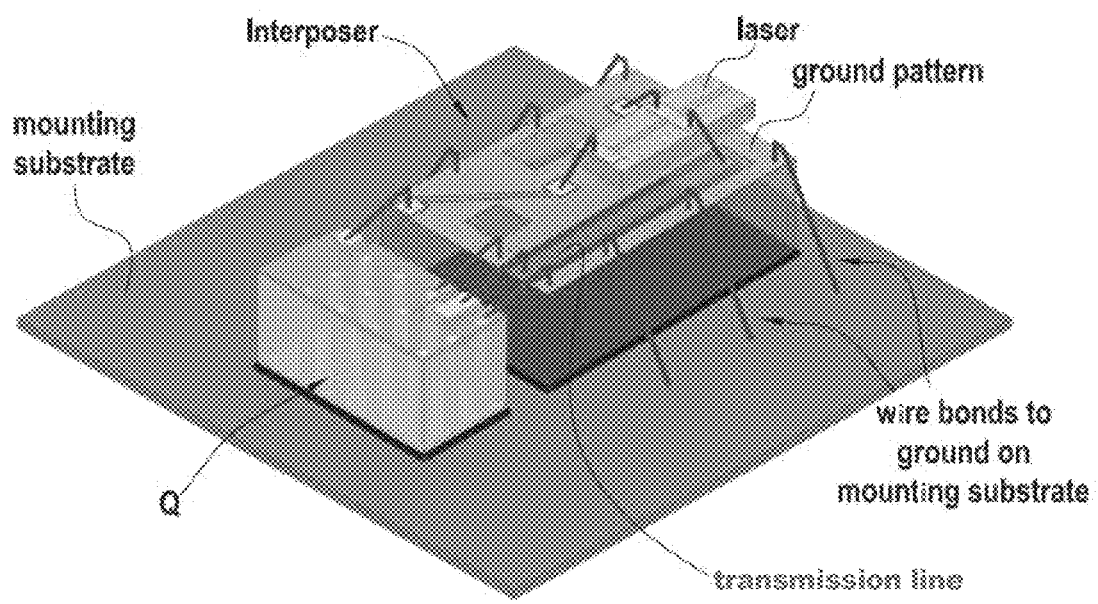
FIG. 3 illustrates schematically an interposer according to the related art, mounted on a mounting substrate and using bonding wires for grounding.
Figure 4:
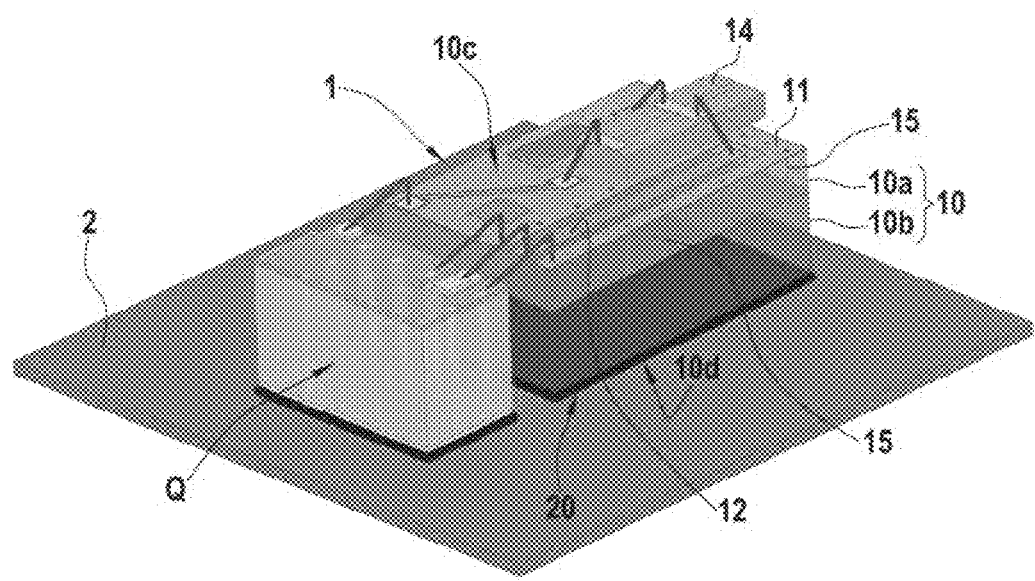
FIG. 4 illustrates schematically an interposer according to an exemplary embodiment of the invention, mounted on a mounting substrate.

As can be seen from FIG. 4, an interposer 1 of the exemplary embodiment includes a substrate 10 which is a composite substrate including of first and second portions 10a, 10b (e.g., substrate layers). The first portion, 10a, of the substrate is a high-resistivity portion extending from a first surface 10c of the interposer (e.g., positioned at the top of the interposer in the orientation illustrated in FIG. 4) into the bulk of the substrate. The second portion, 10b, of the interposer substrate is a low-resistivity portion extending from the high-resistivity portion 10a to a second surface 10d of the interposer (e.g., positioned at the bottom of the interposer in the orientation illustrated in FIG. 4) opposite to the first surface 10c. Typical interposer dimensions are length of 1.5 mm, width of 1 mm and thickness/height of 0.5 mm according to an exemplary aspect.

FIG. 4 represents the interposer 1 in a state where it is mounted on a mounting substrate 2 (e.g., a printed circuit board, or other support) and connected to another component Q by bonding wires. The nature of the component Q is not germane to the invention and so this component shall not be discussed further in this document. The first surface 10c of the interposer substrate faces away from the mounting substrate 2 and the second surface of the interposer substrate, 10d, is positioned on the mounting substrate 2. Moreover, the interposer can be fixed to the mounting substrate in any convenient manner, for example via backside metallization 20 as illustrated in FIG. 4, by solder paste, and the like.

A grounding pattern 11 is provided on the first surface 10c of the interposer substrate. The grounding pattern 11 covers a large fraction of the first surface 10c of the interposer substrate. A transmission line 12 is also provided on the first surface 10c of the interposer substrate with a gap between the periphery of the transmission line 12 and neighbouring portions of the grounding pattern 11. This example relates to an optical interposer 1 in which a laser 14 is also mounted on the interposer and is connected to the component Q by the transmission line 12. The high-resistivity portion 10a of the interposer substrate prevents, or at least reduces, current leakage from the transmission line 12 to the mounting substrate 2.

The thickness of the high-resistivity portion 10a of the substrate is set dependent on the total thickness and permittivity of the interposer, as well as on the dimensions (i.e., the width and gap) of the transmission line permittivity. In particular, the thickness of the high-resistivity portion 10a is preferably set sufficiently large so as to achieve desired performance in terms of blocking leakage-current/reduction of electrical losses from the transmission line. In exemplary embodiments, the high-resistivity portion 10a of the interposer substrate has a thickness taking a value that can range from approximately 10 µm to approximately 400 µm, more preferably greater than 150 µm, so as to reduce current leakage from the transmission line 12 to the mounting substrate 2 to a minimal, or tolerable, amount. A typical thickness value for the high-resistivity portion 10a is 200 µm.

It is noted that the invention is not particularly concerned with other particularities of the transmission line and laser used in example embodiments such as that illustrated in FIG. 4 and, accordingly, no further details of those components will be given here.

In the interposer illustrated in FIG. 4, a plurality of blind via-holes 15 extend from the first surface 10c of the interposer substrate, through the high-resistivity portion 10a of the substrate and into the low-resistivity portion 10b of the substrate where they finish still some distance away from the second surface 10d of the interposer substrate. Electrically conductive material (see FIG. 5) is provided on the sidewalls of the blind via-holes and/or as a filling that completely or partially fills the via-holes. A top-to-bottom connection is established between the grounding pattern 11 on the first surface of the interposer substrate and a grounding pattern (not shown) provided on the mounting substrate 2 via the electrically-conductive material in the blind via-holes 15 and via the low-resistivity portion 10b of the interposer substrate. This connection is established in a space-saving manner within the existing footprint of the interposer substrate 10 on the mounting substrate 2.

In the context illustrated in FIG. 4, where the through-interposer connection serves for grounding in an optical interposer, it is desirable for the number and dimensions of the blind via-holes to be set with a view to achieving a target value for the impedance of the coplanar ground plane 11 relative to the characteristic impedance (Zcl) of the transmission line provided on the interposer. For example, the number and dimensions of the via-holes may be set with a view to making the impedance of the ground plane 11 low relative to Zcl. For example, the target impedance value for the coplanar ground plane 11 may be set at less than 10% of Zcl. So, for instance, if the transmission line's characteristic impedance is 50 Ohm then the impedance of its coplanar ground plane may be set at <5 ohms by controlling the properties of the blind via-holes. The impedance of one via will depend on its chosen dimensions. The minimum number of vias will depend on the necessary number to reach the target impedance for the grounding pattern 11.

Moreover, in an exemplary aspect, the thickness of the low-resistivity portion 10b of the substrate may be set to achieve a target thickness of the overall interposer, for a given thickness of the high-resistivity portion 10a, with a view to keeping the length of the through-interposer connection short. So, for instance, in the example illustrated in FIG. 4, there is a certain overall height of the interposer (c. 500 μm) that typically is required in view of proper optical alignment of the laser with a neighbouring component. Accordingly, it may be appropriate to determine a target overall thickness $T_{int}$ of the interposer, a target thickness $T_{HR}$ of the high-resistivity portion 10a of the substrate (in view of adequate prevention of current leakage/reduction in losses) and then to set the thickness $T_{LR}$ of the low-resistivity portion 10b to $T_{LR}=T_{int}-T_{HR}$. In most applications, the thickness of the low-resistivity portion 10b of the interposer substrate is in the range from approximately 1 μm to 1 mm so as to keep the length of the ground connection short.

In the interposer illustrated in FIG. 4, the interposer substrate may be made of various different materials. It is convenient to make the substrate 10 of a semiconductor material, for example, silicon, in view of the highly-developed state of manufacturing processes that have been designed to process silicon wafers. Indeed, composite silicon substrates having low-resistivity and high-resistivity layers are known for use in other applications and may be procured for use in making interposers according to embodiments of the invention. However, the invention is not limited to the use of silicon substrates; other substrate materials (notably semiconducting materials) can be used, e.g. GaAs, InP, GaN, InAs, and the like.

In preferred embodiments, the high-resistivity portion 10a of the interposer substrate may have a resistivity value 100 Ω·cm, and more preferably of ≥1 kΩ·cm. In preferred embodiments, the low-resistivity portion 10b of the interposer substrate may have a resistivity value that is no more than 1 Ω·cm, and more preferably that is less than 10 mΩ·cm. Typically, in order to achieve the desired difference between their resistivity values, high-resistivity and low-resistivity portions 10a, 10b of the substrate have different dopant concentrations, and sometimes dopants of different polarities from one another. In one example, the high-resistivity portion 10a of the substrate is $p^{--}$ doped silicon, for example doped with boron, whereas the low-resistivity portion 10b of the substrate is $n^{++}$ doped, for example doped with As, P or Sb.

Figure 5:
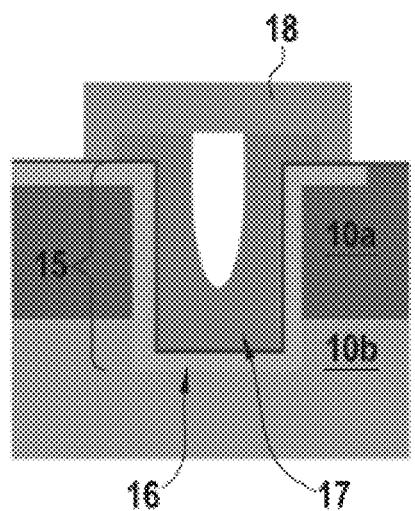
FIG. 5 illustrates schematically an example of a blind via that can be used in the interposer of FIG. 3.

FIG. 5 is a diagram representing, in an enlarged view, an example of a blind via 15 that may be used in the interposer of FIG. 4.

In the example illustrated in FIG. 5, a layer 16 is formed at the sidewalls of the blind via-hole, and the interior of the blind via-hole is partially filled by a filling layer 17. A cap layer 18 is provided to ensure electrical insulation of the sidewall layer 16 (and of the filling layer 17 if it is conductive) from upper layers that may be formed on the interposer. It is noted that the cap layer 18 is not essential. In many cases the blind via-hole 15 is completely filled with material so as to prevent moisture, residues or other foreign material from entering the blind via-hole 15.

The layer 16 formed at the sidewalls of the via is an electrically-conductive layer which serves to conduct current between the grounding pattern 11 on the first surface 10c of the interposer substrate and the low-resistivity portion 10b of that substrate. The layer 16 may comprise a doped semiconductor material. In the latter case, the layer 16 on the via sidewalls has the same dopant polarity as the low-resistivity portion 10b of the interposer substrate. The polarity of the dopant in the layer 16 may be the same as, or opposite to, the polarity of dopants in the high-resistivity portion 10 of the interposer substrate. Typically, the layer 16 is a few microns thick (e.g., up to about 3 μm thick), and has a resistivity up to about 10 Ω/sq. In certain preferred embodiments the resistivity of the layer 16 is around 5 Ω/sq.

When one or more 3D capacitors is/are also formed in the first surface 10c of the interposer substrate, a common doping process may be used to dope the sidewalls of the blind via-hole to form the layer 16 and to dope an electrode layer of the 3D capacitor(s), thus avoiding the need for a specific additional step to achieve the desired doping to form the layer 16.

In some embodiments, the material 17 partially filling the via 15 is a layer of electrically-conductive material which promotes conduction of current between the grounding pattern 11 on the first surface 10c of the interposer substrate and the low-resistivity portion 10b of the substrate. In such a case, the material 17 may be formed of various materials, for example doped semiconductor material.

Doped polysilicon may be used to form the material 17. Such doped polysilicon can contribute to electrical conduction through the via 15 at high frequencies.

The cap layer 18 (if present) may be formed of an insulating material, for example $SiO_2$.

In a case where one or more 3D capacitors is/are also formed in the first surface 10c of the interposer substrate, a common doping process may be used to deposit and dope the filling material layer 17 as to deposit and dope a polysilicon electrode layer of the 3D capacitor(s), avoiding the need for specific additional steps to achieve the deposition and desired doping of the layer 17.

Figure 6:
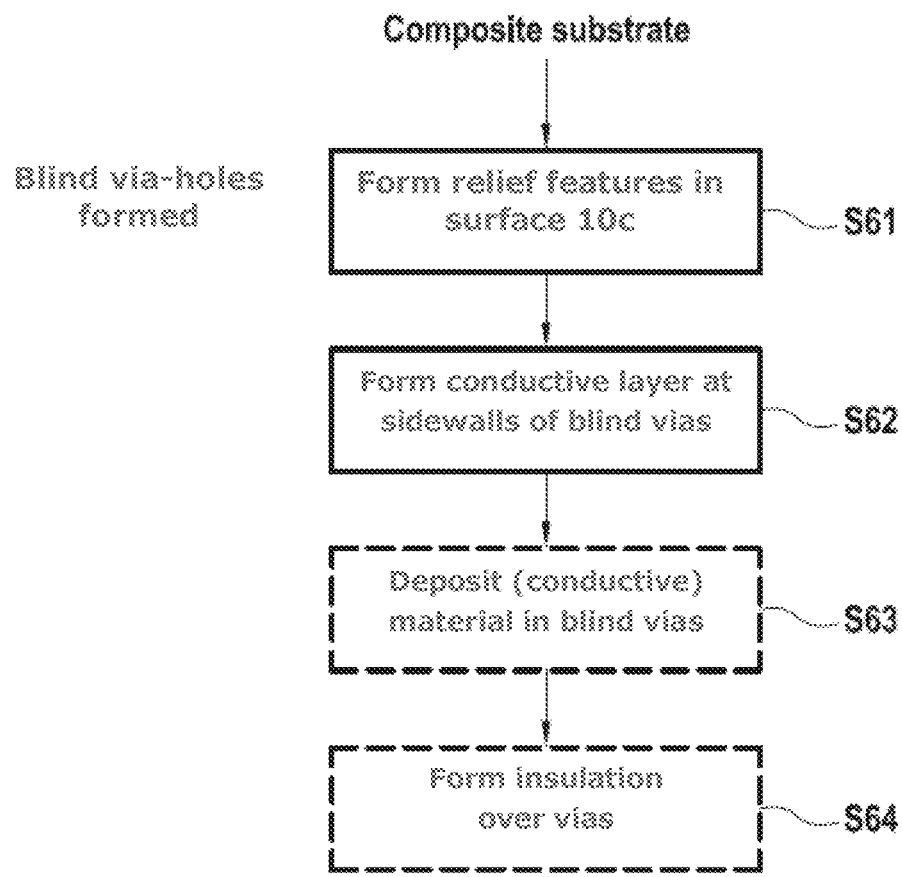
FIG. 6 is a flow diagram illustrating the main stages in a method, according to an exemplary embodiment of the present invention, for fabricating an interposer such as that of FIG. 4.

FIG. 6 is a flow diagram setting out a sequence of processes in an exemplary method of fabricating an interposer according to certain embodiments of the invention. In the method illustrated in FIG. 6, it is assumed that a composite substrate comprising a high-resistivity portion 10a and a low-resistivity portion 10b is provided as described above. If desired, the composite substrate can be made from scratch using known techniques.

In the example method of FIG. 6, relief features (e.g., holes, pillars, trenches) are formed in the first surface 10c of the interposer substrate by any suitable process (S61). Various methods may be used to implement the process S61 including, but not limited to, standard deep reactive ion etching (DRIE). This process S61 forms the blind via-holes through the high-resistivity portion 10a of the substrate. This process S61 may also form other desired relief features, for example relief features in/over which 3D capacitors or other components will be formed in the surface 10c of the interposer substrate.

Next, a process (S62) is performed to form a conductive layer at the sidewalls of the blind vias. Various methods may be used to implement the process S62 including, but not limited to, standard doping methods to dope the side-walls of the blind via(s) 15 (e.g. dopant diffusion at high temperature and low pressure). This process S62 forms a doped sidewall layer and this may form layer 16 shown in FIG. 5. This process S62 may also serve to dope sidewalls or layers in/over other relief features, such as holes, trenches or pillars in/over which 3D capacitors or other components will be formed in the surface 10c of the interposer substrate.

If desired, a conductive material may be provided (S63) in the vias 15 by any convenient process. For example, a doped polysilicon material may be deposited in the vias 15, and this may form filling material 17 illustrated in FIG. 5.

Optionally, when upper layers are going to be formed on the interposer, e.g., in relation to formation of other circuit elements of the interposer, an electrically-insulating layer 17 may be formed over the blind via-hole 15, for example by a low-pressure deposition process. When the where the blind via-holes are not completely filled, this cap layer 17 helps to prevent moisture or other foreign material from entering any space remaining in the blind vias 15.

In the above-described example, the method for providing top-to-bottom connection through the interposer substrate forms of simple process steps that in many cases can be shared, that is, common process steps may contribute not only to formation of the top-to-bottom connection, but also contribute to the fabrication of other components (e.g. 3D capacitors) desired at the first surface 10c of the substrate.

It is noted that although the present invention has been described above with reference to certain specific embodiments, it will be understood that the invention is not limited by the particularities of the specific embodiments. Numerous variations, modifications and developments may be made in the specified embodiments within the scope of the appended claims.

The invention claimed is:

1. An interposer comprising:
  a substrate including a high-resistivity portion extending from a first surface of the substrate into a bulk of the substrate and a low-resistivity portion extending from the high-resistivity portion to a second surface of the substrate that is opposite to the first surface;
  a grounding pattern disposed on the first surface of the substrate;
  a transmission line disposed on the first surface of the substrate and coplanar with the grounding pattern;
  a set of blind via-holes extending from the first surface of the substrate through the high-resistivity portion of the substrate into the low-resistivity portion of the substrate; and
  electrically-conductive material disposed in each of the set of blind via-holes that interconnects the grounding pattern on the first surface of the substrate to the low resistivity portion of the substrate;
  wherein the grounding pattern has an impedance value that is less than 10% of a characteristic impedance of the transmission line based on a number of the set of blind via-holes and respective dimensions of the blind via-holes,
  wherein the characteristic impedance of the transmission line is 50 Ohms such that the impedance value of the grounding pattern is set to be less than 5 Ohms by controlling properties of the blind via-holes that include the number of the set of blind via-holes and respective dimensions of the blind via-holes, and
  wherein the high-resistivity portion has a thickness between 10 μm and 400 μm.

2. The interposer according to claim 1, wherein the electrically-conductive material in the set of blind via-hole comprises a conductive layer disposed on respective side wall of each of the blind via-holes.

3. The interposer according to claim 2, wherein the low-resistivity portion of the substrate and the conductive layer both comprise a semiconductor material that is doped by dopants of a same polarity as one another.

4. The interposer according to claim 3, wherein the high-resistivity portion of the substrate and the conductive layer both comprise a semiconductor material that is doped by dopants of a same polarity or an opposite polarity from one another.

5. The interposer according to claim 4, wherein the high-resistivity portion comprises a p−− doped semiconductor material and the low-resistivity portion comprises an n++ doped semiconductor material.

6. The interposer according to claim 1, wherein the electrically-conductive material in each of the blind via-holes comprises a doped polysilicon filling material.

7. The interposer according to claim 1, wherein a gap is disposed between the transmission line and the grounding pattern on the first surface of the substrate.

8. The interposer according to claim 1, wherein the dimensions of the blind via-holes comprise respective widths of the blind via-holes.

9. The interposer according to claim 1, wherein the thickness of the high-resistivity portion is greater than 150 μm.

10. The interposer according to claim 1, wherein the high-resistivity portion has a resistivity value $\geq 100$ $\Omega \cdot cm$ and the low-resistivity portion has a resistivity value that is no more than 1 $\Omega \cdot cm$.

11. The interposer according to claim 2, further comprising a cap layer disposed on each of the set of blind via-holes to electrically insulate the conductive layer disposed on respective side wall of each of the set of blind via-holes.

12. An interposer comprising:
  a substrate including a high-resistivity layer extending from a first surface of the substrate into a body of the substrate and a low-resistivity layer extending from the high-resistivity layer to a second surface of the substrate that is opposite to the first surface;
  a grounding pattern disposed on the first surface of the substrate;
  a transmission line disposed on the first surface of the substrate and coplanar with the grounding pattern;
  a set of blind via-holes extending from the first surface of the substrate through the high-resistivity layer and into the low-resistivity layer; and
  electrically-conductive material disposed in each of the set of blind via-holes that interconnects the grounding pattern on the first surface of the substrate to the low resistivity layer of the substrate;
  wherein the grounding pattern has an impedance value that is less than 10% of a characteristic impedance of the transmission line based on a number of the set of blind via-holes and respective dimensions of the blind via-holes, and
  wherein the characteristic impedance of the transmission line is 50 Ohms such that the impedance value of the grounding pattern is set to be less than 5 Ohms by controlling properties of the blind via-holes that include the number of the set of blind via-holes and respective dimensions of the blind via-holes.

13. The interposer according to claim 12, wherein the high-resistivity layer has a thickness between 10 μm and 400 μm.

14. The interposer according to claim 12, wherein the electrically-conductive material in the set of blind via-hole comprises a conductive layer disposed on respective side wall of each of the blind via-holes.

15. The interposer according to claim 12, wherein the low-resistivity layer of the substrate and the conductive layer both comprise a semiconductor material that is doped by dopants of a same polarity as one another.

16. The interposer according to claim 15, wherein the high-resistivity layer of the substrate and the conductive layer both comprise a semiconductor material that is doped by dopants of a same polarity or an opposite polarity from one another.

17. A method of fabricating an interposer, comprising:
  forming relief features in a first surface of a composite substrate that includes a high-resistivity portion that extends from the first surface into a bulk of the substrate, and a low-resistivity portion that extends from the high-resistivity portion to a second surface of the substrate opposite to the first surface, and the relief features include a set of blind via-holes that extend from the first surface of the substrate through the high-resistivity portion of the substrate and into the low-resistivity portion of the substrate;
  forming a grounding pattern on the first surface of the substrate;
  forming a transmission line on the first surface of the substrate that is coplanar with the grounding pattern;
  forming an electrically-conductive layer at respective side walls of the set of blind via-holes;
  connecting the electrically-conductive sidewall layer to the grounding pattern on the first surface of the substrate and, with the low-resistivity portion of the substrate, forming a grounding path for current through the interposer substrate;
  wherein an impedance value of the grounding pattern is less than 10% of a characteristic impedance of the transmission line due to a number of the set of blind via-holes and respective dimensions of the blind via-holes,
  wherein the characteristic impedance of the transmission line is 50 Ohms such that the impedance value of the grounding pattern is set to be less than 5 Ohms by controlling properties of the blind via-holes that include the number of the set of blind via-holes and respective dimensions of the blind via-holes, and
  wherein the high-resistivity portion has a thickness between 10 μm and 400 μm.

18. The interposer-fabricating method according to claim 17, further comprising wholly or partially filling each of the set of blind via-holes with an electrically-conductive material.

19. The interposer-fabricating method according to claim 18, wherein the electrically-conductive material is doped polysilicon.

20. The interposer-fabricating method according to claim 17, further comprising forming one or more additional components at the first surface of the substrate concurrently with a process step of forming an element contributing to the current path through the interposer.

* * * * *